(12) United States Patent
Chien et al.

(10) Patent No.: US 9,263,257 B2
(45) Date of Patent: Feb. 16, 2016

(54) SEMICONDUCTOR DEVICE HAVING FIN-SHAPED STRUCTURE AND METHOD FOR FABRICATING THE SAME

(71) Applicant: UNITED MICROELECTRONICS CORP., Hsin-Chu (TW)

(72) Inventors: Chin-Cheng Chien, Tainan (TW); Hsin-Kuo Hsu, Kaohsiung (TW); Chih-Chien Liu, Taipei (TW); Chin-Fu Lin, Tainan (TW); Chun-Yuan Wu, Yun-Lin County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 58 days.

(21) Appl. No.: 14/312,707

(22) Filed: Jun. 24, 2014

(65) Prior Publication Data
US 2015/0357190 A1    Dec. 10, 2015

(30) Foreign Application Priority Data
Jun. 5, 2014    (CN) .......................... 2014 1 0247402

(51) Int. Cl.
| | | |
|---|---|---|
| *H01L 21/205* | (2006.01) | |
| *H01L 21/336* | (2006.01) | |
| *H01L 21/8232* | (2006.01) | |
| *H01L 29/08* | (2006.01) | |
| *H01L 29/16* | (2006.01) | |
| *H01L 29/43* | (2006.01) | |
| *H01L 29/78* | (2006.01) | |
| *H01L 29/417* | (2006.01) | |
| *H01L 21/02* | (2006.01) | |
| *H01L 21/311* | (2006.01) | |
| *H01L 29/36* | (2006.01) | |
| *H01L 29/06* | (2006.01) | |

(52) U.S. Cl.
CPC .... *H01L 21/02532* (2013.01); *H01L 21/31111* (2013.01); *H01L 29/06* (2013.01); *H01L 29/0657* (2013.01); *H01L 29/36* (2013.01); *H01L 29/785* (2013.01); *H01L 29/7853* (2013.01)

(58) Field of Classification Search
None
See application file for complete search history.

(56) References Cited

U.S. PATENT DOCUMENTS

| | | | |
|---|---|---|---|
| 6,800,910 B2 | 10/2004 | Lin et al. | |
| 9,112,030 B2 * | 8/2015 | Liao | H01L 29/785 |
| 2010/0193840 A1 | 8/2010 | Doyle et al. | |
| 2015/0123210 A1 * | 5/2015 | Liao | H01L 29/785 |
| | | | 257/401 |
| 2015/0171085 A1 * | 6/2015 | Fumitake | H01L 27/0924 |
| | | | 257/369 |
| 2015/0249138 A1 * | 9/2015 | Chao | H01L 29/66795 |
| | | | 438/283 |
| 2015/0279971 A1 * | 10/2015 | Xie | H01L 29/785 |
| | | | 257/401 |

* cited by examiner

*Primary Examiner* — Joseph Schoenholtz
(74) *Attorney, Agent, or Firm* — Winston Hsu; Scott Margo

(57) ABSTRACT

A semiconductor device with fin-shaped structure is disclosed. The semiconductor device includes: a substrate; a fin-shaped structure on the substrate; and an epitaxial layer on a top surface and part of the sidewall of the fin-shaped structure, in which the epitaxial layer and the fin-shaped structure includes a linear gradient of germanium concentration therebetween.

9 Claims, 4 Drawing Sheets

SEMICONDUCTOR DEVICE HAVING FIN-SHAPED STRUCTURE AND METHOD FOR FABRICATING THE SAME

BACKGROUND OF THE INVENTION

1. Field of the Invention

The invention relates to a semiconductor device having fin-shaped structure, and more particularly, to a semiconductor device with epitaxial material wrapped around fin-shaped structure.

2. Description of the Prior Art

In recent years, as various kinds of consumer electronic products have continuously improved and been miniaturized, the size of semiconductor components has reduced accordingly, in order to meet requirements of high integration, high performance, and low power consumption.

With the trend in the industry being towards scaling down the size of the metal oxide semiconductor (MOS) transistors, three-dimensional or non-planar transistor technology, such as fin field effect transistor (FinFET) technology has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Nevertheless, conventional FinFET fabrication of utilizing epitaxial materials such as silicon germanium to increase carrier mobility has reached a bottleneck. Hence, how to improve the current FinFET architecture thereby increasing overall carrier mobility has become an important task in this field.

SUMMARY OF THE INVENTION

According to a preferred embodiment of the present invention, a method for fabricating semiconductor device with fin-shaped structure is disclosed. The method includes the steps of: forming a fin-shaped structure on a substrate; forming a first dielectric layer on the substrate and the fin-shaped structure; depositing a second dielectric layer on the first dielectric layer; etching back a portion of the second dielectric layer; removing part of the first dielectric layer to expose a top surface and part of the sidewall of the fin-shaped structure; forming an epitaxial layer for covering the exposed top surface and part of the sidewall of the fin-shaped structure; and removing a portion of the second dielectric layer.

According to another aspect of the present invention, a semiconductor device with fin-shaped structure is disclosed. The semiconductor device includes: a substrate; a fin-shaped structure on the substrate; and an epitaxial layer on a top surface and part of the sidewall of the fin-shaped structure, in which the epitaxial layer and the fin-shaped structure includes a linear gradient of germanium concentration therebetween.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
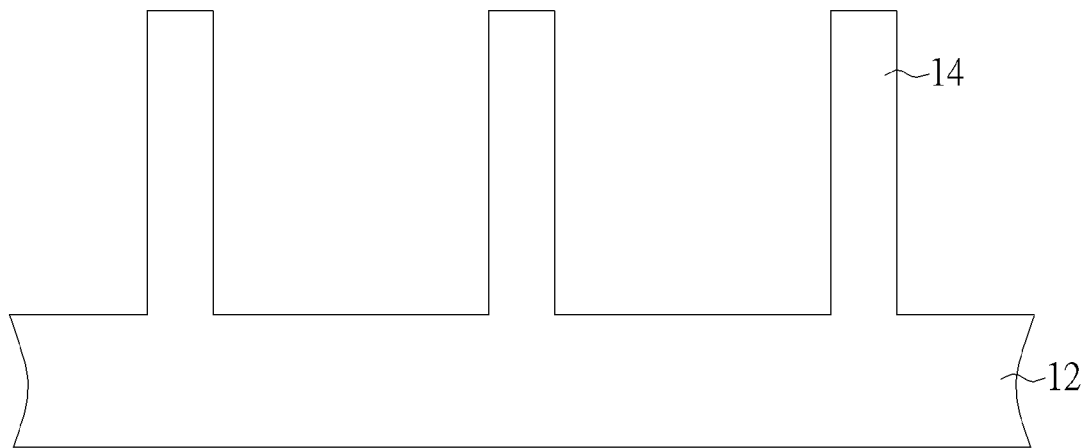
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12, such as a silicon substrate or silicon-on-insulator (SOI) substrate is first provided, and at least one fin-shaped structure 14 is formed on the substrate 12. It should be noted that even though three fin-shaped structures 14 are disclosed in this embodiment, the quantity of the fin-shaped structures 14 is not limited to three, but could be any quantity greater than one.

In addition, the fin-shaped structures 14 of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the underneath substrate, and through additional fin cut processes, desirable pattern structures, such as stripe patterned fin-shaped structures could be obtained.

The fin-shaped structures 14 of this embodiment could also be obtained by first forming a patterned mask (not shown) on the substrate, 12, and through an etching process, the pattern of the patterned mask is transferred to the substrate 12 to form the fin-shaped structures. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming the fin-shaped structures 14 are all within the scope of the present invention.

Figure 2:
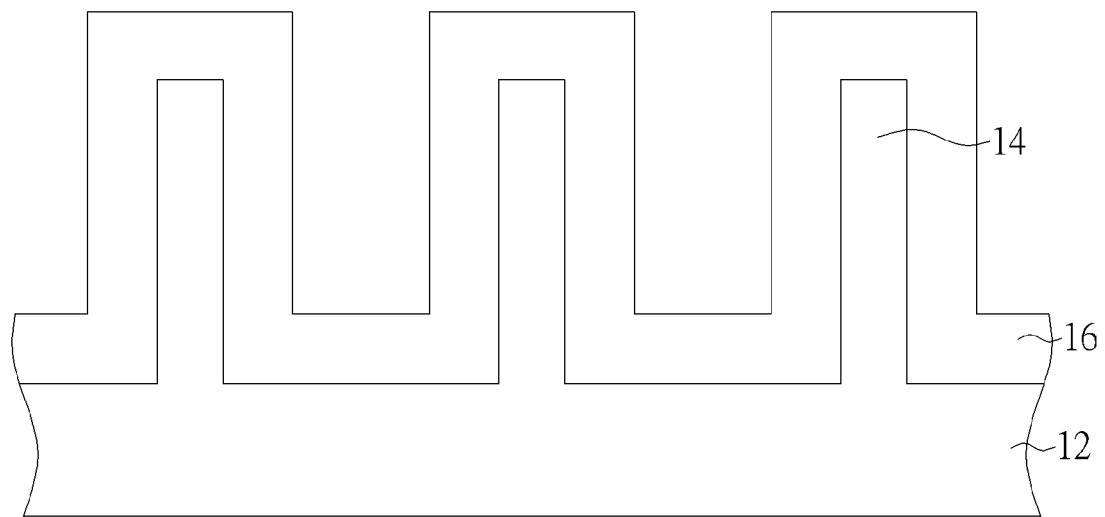

Next, as shown in FIG. 2, an atomic layer deposition (ALD) process is conducted to form a first dielectric 16 for covering the substrate 12 and the fin-shaped structures 14. In this embodiment, the first dielectric layer 14 is preferably an oxide layer composed of silicon dioxide, but not limited thereto.

Figure 3:
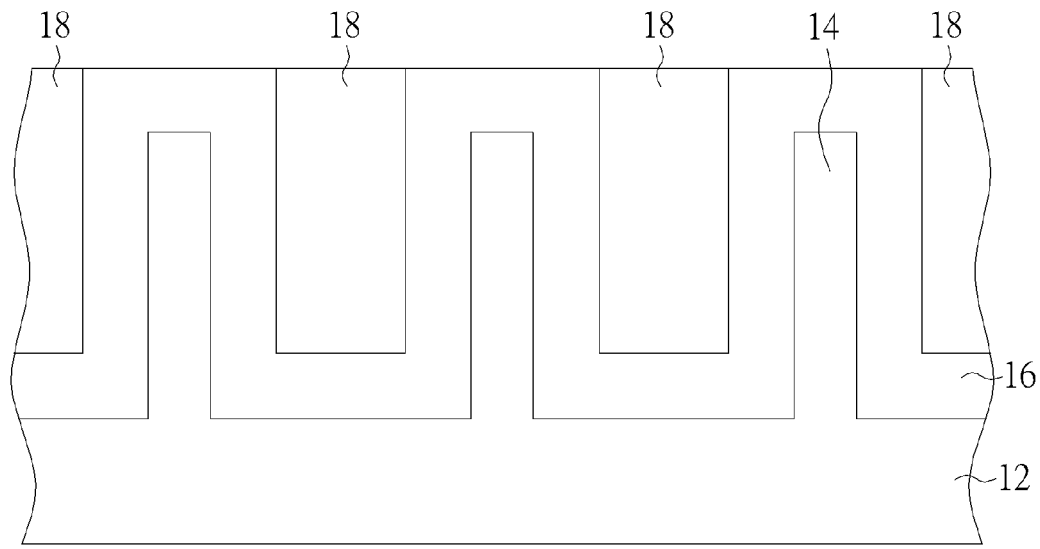

Next, as shown in FIG. 3, a second dielectric 18 is deposited on the first dielectric layer 16, and an etching back process is carried out to remove part of the second dielectric layer 18 so that a top surface of the second dielectric layer 18 is even with the top surface of the first dielectric layer 16. In this embodiment, the second dielectric layer 18 is selected from an advanced pattern film (APF) fabricated by Applied Materials Inc., but not limited thereto. It should also be noted that instead of using the first dielectric layer 16 composed of silicon oxide and the second dielectric layer 18 composed of APF, any two different dielectric materials with etching selectivity therebetween could be utilized as the material for these two dielectric layers 16 and 18, which is also within the scope of the present invention.

Figure 4:
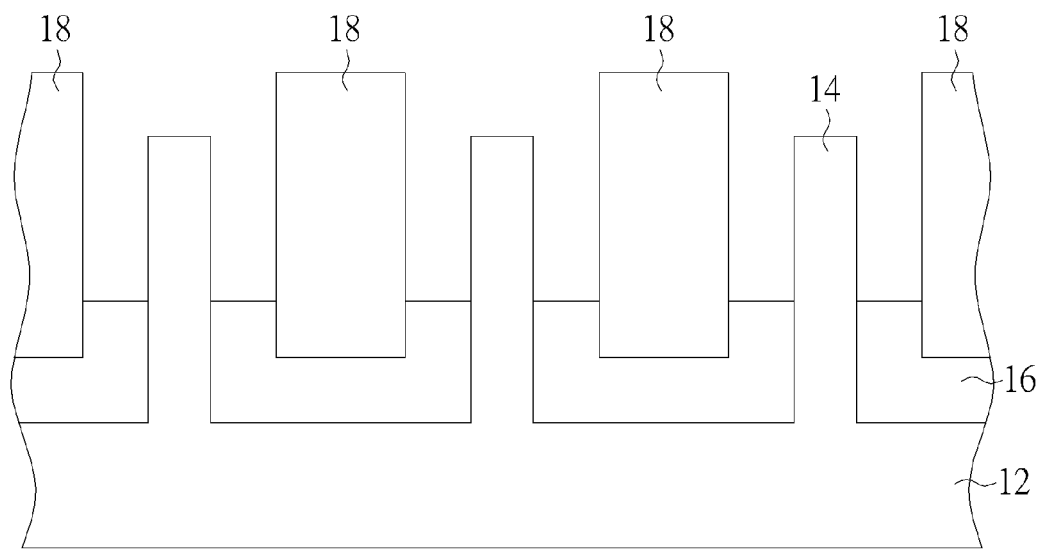

As shown in FIG. 4, an etching process, preferably a wet etching process is then conducted by using the second dielectric layer 18 as mask and using diluted HF (DHF) as etchant to remove part of the first dielectric layer 16 for exposing a top surface and part of the sidewall of the fin-shaped structures 14. In this embodiment, the height of the exposed fin-shaped structures 14 is approximately 400 Angstroms.

Figure 5:
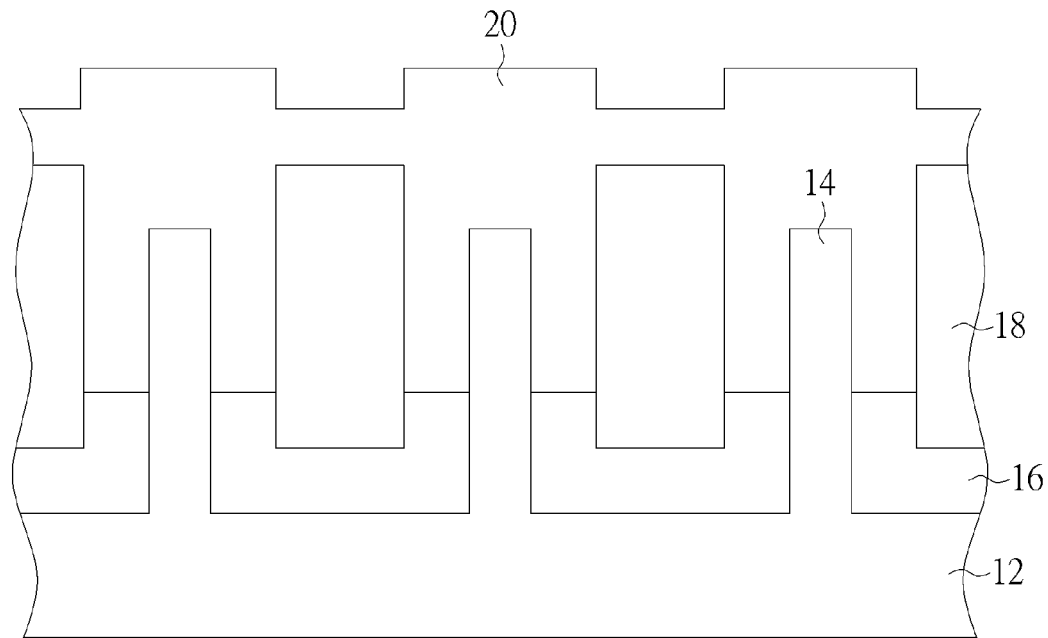

Next, as shown in FIG. 5, a selective epitaxial growth process is conducted to form an epitaxial layer 20 on the first dielectric layer 16 while covering the exposed top surfaces and part of the sidewalls of the fin-shaped structures 14 and the second dielectric layer 18. In this embodiment, the epitaxial layer 20 is preferably an epitaxial structure having different lattice structure from the fin-shaped structures 14, such as a silicon germanium layer or silicon carbide layer, or a pure silicon layer or a silicon phosphorus layer. As the semiconductor device of this embodiment pertains to a PMOS transistor, the epitaxial layer 20 is preferably composed of silicon germanium. In addition, a linear gradient of germanium concentration is also included between the fin-shaped structure 14 and the epitaxial layer 20 depending on the material composition of the fin-shaped structure 14. For instance, the germanium concentration within the fin-shaped structures 14 and the epitaxial layer 20 could be adequately adjusted according to the demand of the product such that a concentration of germanium could increase linearly from the fin-shaped structures 14 toward the epitaxial layer 20, or increase linearly from the epitaxial layer 20 toward the fin-shaped structures 14, which are all within the scope of the present invention.

Figure 6:
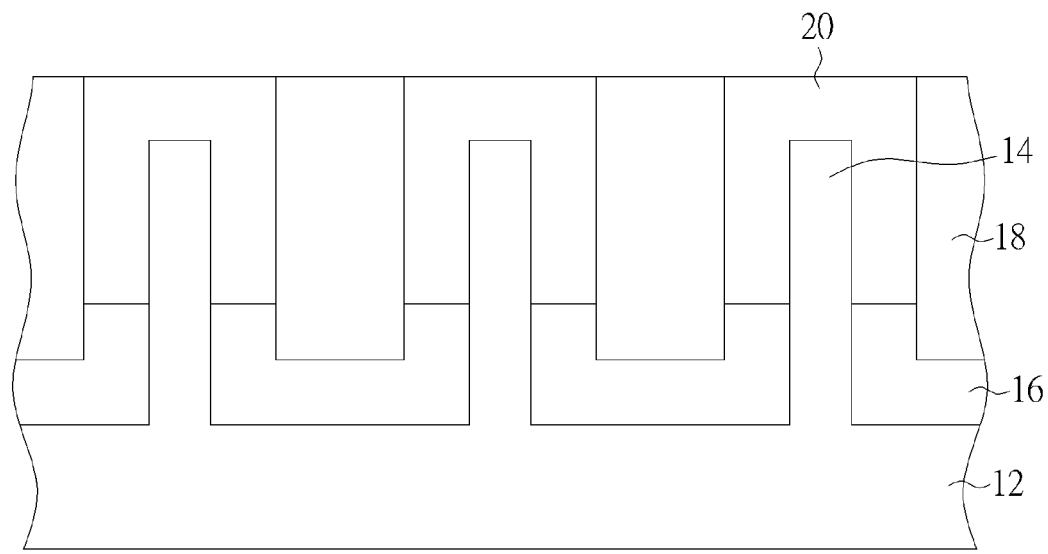

Next, as shown in FIG. 6, a planarizing process, such as a chemical mechanical polishing (CMP) process and/or etching back process could be employed to planarize the epitaxial layer 20 so that the surface of the epitaxial layer 20 is even with the surface of the second dielectric layer 18. It should be noted that instead of utilizing the planarizing process to partially remove the epitaxial layer 20 after forming the epitaxial layer 20 is formed, it would also be desirable during the growth of the epitaxial layer 20 to control the height of the epitaxial layer 20 to be at least higher than the top surface of the fin-shaped structures 14 and preferably even with the surface of the second dielectric layer 18. By using this approach the aforementioned planarizing process could be omitted and overall fabrication cost is also lowered substantially, which is also within the scope of the present invention.

Figure 7:
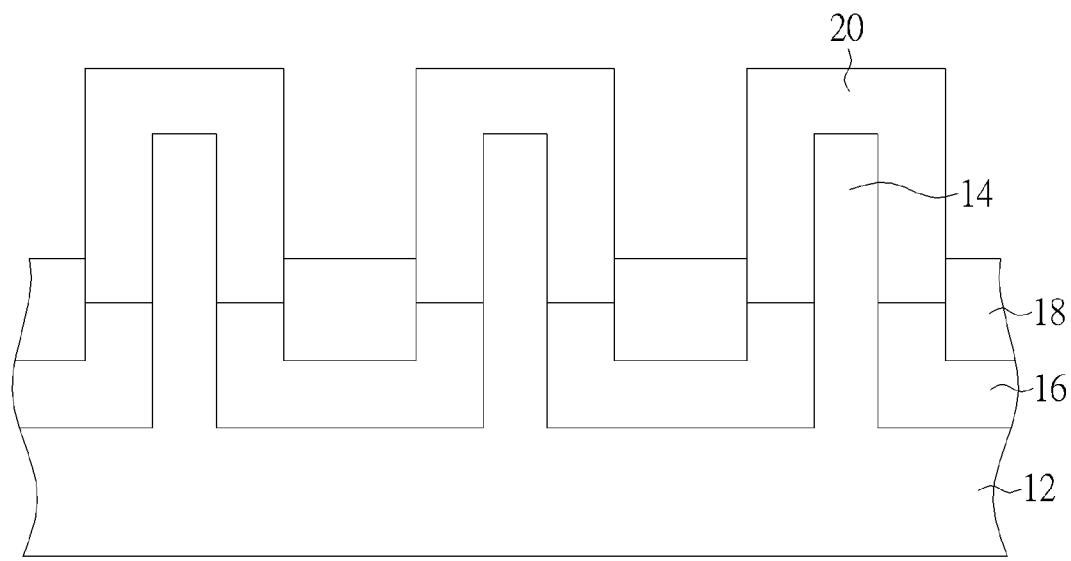

Next, as shown in FIG. 7, another etching process is conducted by using the epitaxial layer 20 as mask to remove part of the second dielectric layer 18 and expose part of the sidewall of the epitaxial layer 20. In this embodiment, the height of the remaining second dielectric layer 18 is preferably slightly higher than a junction between the first dielectric layer 16 and the epitaxial layer 20, and the distance from the top surface of the remaining second dielectric layer 18 to the top surface of the epitaxial layer 20 preferably becomes the channel height for the carriers. This completes the fabrication of a semiconductor device with fin-shaped structures according to a preferred embodiment of the present invention.

Next, according to an embodiment of the present invention, a silicon cap (not shown) composed of pure silicon could be selectively formed on the top surface and sidewall of the epitaxial layer 20 and part of the second dielectric layer 18 surface, and a standard Fin-FET fabrication could be continued to form elements such as gate structures on the epitaxial layer 20, lightly doped drains, and source/drain regions. A replacement metal gate (RMG) process could also be conducted depending on the demand of the product. As these fabrications are well known to those skilled in the art, the details of which are not explained herein for the sake of brevity.

It should be noted that according to an embodiment of the present invention, instead of forming the aforementioned first dielectric layer 16, second dielectric layer 18, and epitaxial layer 20 before a gate structure is formed, an epitaxial layer wrapped around a source/drain region along with adjacent first dielectric layer and second dielectric layer, such as the ones shown in FIG. 7, could also be formed on a predetermined source/drain region of the fin-shaped structure after a gate structure is formed, which is also within the scope of the present invention. Moreover, according to another embodiment of the present invention, instead of using a first dielectric layer 16 composed of silicon oxide, a second dielectric layer 18 composed of APF, and an epitaxial layer 20 composed of silicon germanium, any three different materials or any materials with different etching selectivity could all be used for these three layers 16, 18, 20, which is also within the scope of the present invention.

Referring again to FIG. 7, which further illustrates a structural view of a semiconductor device with fin-shaped structures according to an embodiment of the present invention. As shown in FIG. 7, the semiconductor device preferably includes a substrate 12, a plurality of fin-shaped structures 14 disposed on the substrate 12, an epitaxial layer 20 disposed on a top surface and part of the sidewall of the fin-shaped structures 14, a first dielectric layer 16 disposed on part of the sidewall of the fin-shaped structures 14, and a second dielectric layer 18 disposed on the first dielectric layer 16. Preferably, the first dielectric layer 16 is formed conformally along the surface of the substrate 12 and the sidewall of the fin-shaped structures 14 while disposed between the epitaxial layer 20 and the substrate 12, and the height of the second dielectric layer 18 is preferably higher than a junction between the epitaxial layer 20 and the first dielectric layer 16. In addition, as the epitaxial layer 20 is formed in the spacer in which the first dielectric layer 16 had previously been removed, the thickness of the epitaxial layer 20 between the fin-shaped structures 14 and the second dielectric layer 18 is preferably equal to or less than the thickness of the first dielectric layer 16 between the sidewall of the fin-shaped structures 14 and the second dielectric layer 18.

In this embodiment, the first dielectric layer 16 is preferably an oxide layer composed of silicon oxide, the second dielectric layer is preferably selected from an advanced pattern film (APF) fabricated by Applied Materials Inc., the epitaxial layer 20 is preferably composed a silicon germanium layer, and a linear gradient of germanium concentration is included between the fin-shaped structures 14 and the epitaxial layer 20. For instance, the germanium concentration within the fin-shaped structures 14 and the epitaxial layer 20 could be adequately adjusted according to the demand of the product such that a concentration of germanium could increase linearly from the fin-shaped structures 14 toward the epitaxial layer 20 to form a structure such as a silicon germanium epitaxial layer wrapped around a silicon fin-shaped structure, or increase linearly from the epitaxial layer 20 toward the fin-shaped structures 14 to form a structure such as silicon germanium epitaxial layer wrapped around a silicon germanium fin-shaped structure, which are all within the scope of the present invention.

Overall, the present invention forms a first dielectric layer on the substrate and fin-shaped structures before forming a gate structure, deposits a second dielectric layer on the first dielectric layer, etches back part of the second dielectric layer, removes part of the first dielectric layer to expose the fin-shaped structures, forms an epitaxial layer to cover the exposed fin-shaped structures, and finally removes part of the second dielectric layer. By using the aforementioned approach to wrap the top portion of fin-shaped structures with an epitaxial layer along with a linear gradient of germanium concentration between the epitaxial layer and the fin-shaped structures, the carrier mobility in the channel region of the gate structure formed afterwards could be improved substantially thereby improving the performance of the FinFET.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device with fin-shaped structure, comprising:
   a substrate;
   a fin-shaped structure on the substrate; and
   an epitaxial layer on a top surface and part of the sidewall of the fin-shaped structure, wherein the epitaxial layer and the fin-shaped structure comprises a linear gradient of germanium concentration therebetween.

2. The semiconductor device with fin-shaped structure of claim 1, wherein a concentration of germanium increases linearly from the fin-shaped structure toward the epitaxial layer.

3. The semiconductor device with fin-shaped structure of claim 1, wherein a concentration of germanium increases linearly from the epitaxial layer toward the fin-shaped structure.

4. The semiconductor device with fin-shaped structure of claim 1, further comprising a first dielectric layer on part of the sidewall of the fin-shaped structure.

5. The semiconductor device with fin-shaped structure of claim 4, wherein the first dielectric layer is between the epitaxial layer and the substrate.

6. The semiconductor device with fin-shaped structure of claim 4, wherein the first dielectric layer comprises an oxide layer.

7. The semiconductor device with fin-shaped structure of claim 4, further comprising a second dielectric layer on the first dielectric layer.

8. The semiconductor device with fin-shaped structure of claim 7, wherein the height of the second dielectric layer is higher than a junction between the epitaxial layer and the first dielectric layer.

9. The semiconductor device with fin-shaped structure of claim 7, wherein the second dielectric layer comprises an Advanced Patterning Film (APF).

* * * * *